US012604638B2

(12) United States Patent
Wang et al.

(10) Patent No.: US 12,604,638 B2
(45) Date of Patent: Apr. 14, 2026

(54) DISPLAY SUBSTRATE, DISPLAY MOTHER BOARD AND DISPLAY APPARATUS INCLUDING HOLLOWED-OUT REGION

(71) Applicants: Chengdu BOE Optoelectronics Technology Co., Ltd., Chengdu (CN); BOE Technology Group Co., Ltd., Beijing (CN)

(72) Inventors: Wei Wang, Beijing (CN); Bin Liu, Beijing (CN); Xin Zhou, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 161 days.

(21) Appl. No.: 17/912,623

(22) PCT Filed: Nov. 15, 2021

(86) PCT No.: PCT/CN2021/130567
§ 371 (c)(1),
(2) Date: Sep. 19, 2022

(87) PCT Pub. No.: WO2022/222447
PCT Pub. Date: Oct. 27, 2022

(65) Prior Publication Data
US 2024/0206286 A1 Jun. 20, 2024

(30) Foreign Application Priority Data

Apr. 21, 2021 (CN) .......................... 202110429787.3

(51) Int. Cl.
*H10K 59/80* (2023.01)
*H10K 59/12* (2023.01)
*H10K 59/122* (2023.01)

(52) U.S. Cl.
CPC ........... *H10K 59/873* (2023.02); *H10K 59/12* (2023.02); *H10K 59/122* (2023.02)

(58) Field of Classification Search
CPC ...... H10K 59/873; H10K 59/40; H10K 59/38; H10K 59/12; H10K 59/122; H10K 50/844
See application file for complete search history.

(56) References Cited

U.S. PATENT DOCUMENTS

2014/0306260 A1* 10/2014 Yamazaki ........... H04M 1/0266
257/99
2016/0284781 A1 9/2016 Jiang et al.
(Continued)

FOREIGN PATENT DOCUMENTS

CN 104868058 A 8/2015
CN 108428724 A 8/2018
(Continued)

OTHER PUBLICATIONS

PCT/CN2021/130567 international search report and written opinion.

*Primary Examiner* — Ida M Soward
(74) *Attorney, Agent, or Firm* — IPro, PLLC

(57) ABSTRACT

Provided is a display substrate, which includes: a base substrate, a light-emitting unit provided on the base substrate, and an encapsulation layer provided on a side of the light-emitting unit away from the base substrate. The display substrate includes a display area and a non-display area at a periphery of the display area, a functional layer is arranged on a side of the encapsulation layer away from the base substrate, the functional layer includes a patterned region in the non-display area, a pattern of the patterned region includes a hollowed-out region and a filling region, and the hollowed-out region forms an air column.

12 Claims, 8 Drawing Sheets

(56)             References Cited

U.S. PATENT DOCUMENTS

| | | | |
|---|---|---|---|
| 2019/0189715 A1* | 6/2019 | Nendai | H10K 59/122 |
| 2019/0252415 A1* | 8/2019 | Wan | H10D 86/0212 |
| 2020/0006704 A1* | 1/2020 | Zhang | H10K 71/231 |
| 2020/0409419 A1* | 12/2020 | He | G06F 1/189 |
| 2021/0049939 A1* | 2/2021 | Sui | G06F 1/1652 |
| 2021/0359282 A1* | 11/2021 | Sun | H10K 77/111 |
| 2021/0362467 A1 | 11/2021 | Liu et al. | |
| 2024/0282782 A1* | 8/2024 | Li | H10D 86/60 |

FOREIGN PATENT DOCUMENTS

| | | | | | |
|---|---|---|---|---|---|
| CN | 109449315 A | | 3/2019 | | |
| CN | 109545831 A | | 3/2019 | | |
| CN | 110231886 A | * | 9/2019 | | G06F 3/0412 |
| CN | 111430412 A | * | 7/2020 | | H10K 59/12 |
| CN | 113130617 A | | 7/2021 | | |
| WO | 2019233136 A1 | | 12/2019 | | |
| WO | WO-2021017986 A1 | * | 2/2021 | | H10K 59/873 |

* cited by examiner

DISPLAY SUBSTRATE, DISPLAY MOTHER BOARD AND DISPLAY APPARATUS INCLUDING HOLLOWED-OUT REGION

CROSS-REFERENCE TO RELATED APPLICATIONS

This application is the U.S. national phase of PCT Application No. PCT/CN2021/130567 filed on Nov. 15, 2021, which claims a priority to Chinese Patent Application No. 202110429787.3 filed in China on Apr. 21, 2021, the entire contents of which are hereby incorporated by reference.

TECHNICAL FIELD

The present disclosure relates to the technical field of manufacture of display products, and more particularly, to a display substrate, a display mother board and a display apparatus.

BACKGROUND

During the preparation of an organic electroluminescent display panel, in order to improve the production efficiency and reduce the production cost, organic electroluminescent display panels are generally prepared as an integral part on a mother board and then cut to obtain single organic electroluminescent display panel. Taking the manufacture of a display panel mother board encapsulated with a flexible substrate film as an example, firstly, a plurality of display cells are manufactured on the display panel mother board in an arrangement of high utilization (usually in an array), the plurality of manufactured display cells are encapsulated by a thin film layer, and cut and separated in a spacer region between adjacent two display cells, and then the plurality of independent flexible display panels are subjected to other subsequent processes. However, with the requirement of narrowing a lower frame, the process requires that the half-cut line of an upper protective film needs to be cut above the thin film encapsulation layer. Due to the poor uniformity of laser energy and the poor flatness of the cutting platform, a panel layer or a position close to the panel layer may be cut during the laser cutting process, the heat is transferred to the panel layer and the encapsulation layer, and the encapsulation layer and the metal organic film layer under the encapsulation layer, which are made of different materials, may expand to different extents after being heated, resulting in poor separation.

SUMMARY

In order to solve the above technical problem, the present disclosure provides a display mother board, a display substrate, and a display apparatus, which solve the problem that an encapsulation layer is separated caused by laser cutting.

In order to achieve the above objective, embodiments of the present disclosure adopt the following technical solutions: a display substrate, which includes a base substrate, a light-emitting unit on the base substrate, and an encapsulation layer on a side of the light-emitting unit away from the base substrate. The display substrate includes a display area and a non-display area at a periphery of the display area, a functional layer is arranged on a side of the encapsulation layer away from the base substrate, the functional layer includes a patterned region in the non-display area, a pattern of the patterned region includes a hollowed-out region and a filling region, and the hollowed-out region forms an air column.

Optionally, the non-display area includes a barrier wall surrounding the periphery of the display area, the patterned region is located in a first region including the barrier wall, a first edge of the first region at a side of the barrier wall away from the display area is at a distance of 50 μm to 300 μm from the barrier wall, and a second edge of the first region at a side of the barrier wall close to the display area is at a distance of 50 μm to 150 μm from the barrier wall.

Optionally, the pattern includes a first sub-pattern at one side of the display area along a first direction, the first sub-pattern includes a plurality of hollowed-out regions and a plurality of filling regions that are arranged alternately along the first direction, and each of the hollowed-out regions extend in a direction intersecting with the first direction.

Optionally, the plurality of hollowed-out regions include a first hollowed-out sub-region at an edge of the display substrate and a second hollowed-out sub-region other than the first hollowed-out sub-region, and in the first direction, a width of the second hollowed-out sub-region decreases as a distance between the second hollowed-out sub-region and the first hollowed-out sub-region increases.

Optionally, a width of each of the hollowed-out regions in the first direction is 3 μm to 50 μm.

Optionally, the pattern includes a second sub-pattern at one side of the display area along a first direction, the second sub-pattern includes a hollowed-out region and a filling region arranged alternately, the filling region includes a plurality of columns of filling sub-regions arranged at intervals along the first direction, each column of the filling sub-regions includes a plurality of filling portions arranged at intervals along a direction perpendicular to the first direction, and the hollowed-out region includes first hollowed-out sub-regions located between adjacent two columns of filling sub-regions, and second hollowed-out sub-regions located between adjacent two filling portions of the filling portions.

Optionally, the plurality of first hollowed-out sub-regions includes a first hollowed-out portion located at an edge of the display substrate and a second hollowed-out portion other than the first hollowed-out portion, and in the first direction, a width of the second hollowed-out portion decreases as the distance between the second hollowed-out portion and the first hollowed-out portion increases.

Optionally, a width of adjacent two first hollowed-out sub-regions in the first direction is 3 μm to 50 μm, and a width of adjacent two second hollowed-out sub-regions in a second direction perpendicular to the first direction is 3 μm to 50 μm.

Optionally, the filling portions in adjacent two columns of filling sub-regions are arranged in a staggered manner.

Optionally, each of the filling portions has a cross section of strip-shaped structure in a direction parallel to the base substrate, an extension direction of the strip-shaped structure has an included angle with the first direction, adjacent two filling portions in the same column of filling sub-regions are inclined in opposite directions, and adjacent two filling portions in adjacent two columns of filling sub-regions are inclined in a same direction.

Optionally, the functional layer is a touch control film layer, the touch control film layer includes a first metal layer, an insulating layer, a second metal layer and a protective layer that are arranged in sequence along a direction away from the base substrate, and the pattern is formed on at least one film layer of: the first metal layer, the insulating layer, the second metal layer and the protective layer.

Optionally, the functional layer is a color film layer.

An embodiment of the present disclosure further provides a display mother board for forming the above display substrate along a cut line, and an orthographic projection of the cut line onto the functional layer is located within the air column.

An embodiment of the present disclosure further provides a display apparatus including the display substrate as described above.

DETAILED DESCRIPTION

In order to make an objective, technical solution and advantage of embodiments of the present disclosure become more apparent, a more particular description of the embodiments of the present disclosure will be rendered by reference to the appended drawings. It is to be understood that the described embodiments are part, but not all, of the disclosed embodiments. Based on the embodiments of the present disclosure described, all other embodiments obtained by one of ordinary skill in the art shall fall within the protection scope of the present disclosure.

In describing the present disclosure, it should be noted that such terms as "central", "upper", "lower", "left", "right", "vertical", "horizontal", "inner" and "outer", indicate orientations or positional relationships based on the orientations or positional relationships shown in the figures, merely to facilitate description of the present disclosure and simplify the description, and do not indicate or imply that the referenced devices or elements must have a particular orientation, be constructed and operated in a particular orientation, and thus should not be construed as limiting the present disclosure. Furthermore, such terms as "first", "second", and "third" are used for descriptive purposes only and are not to be construed as indicating or implying relative importance.

Figure 1:
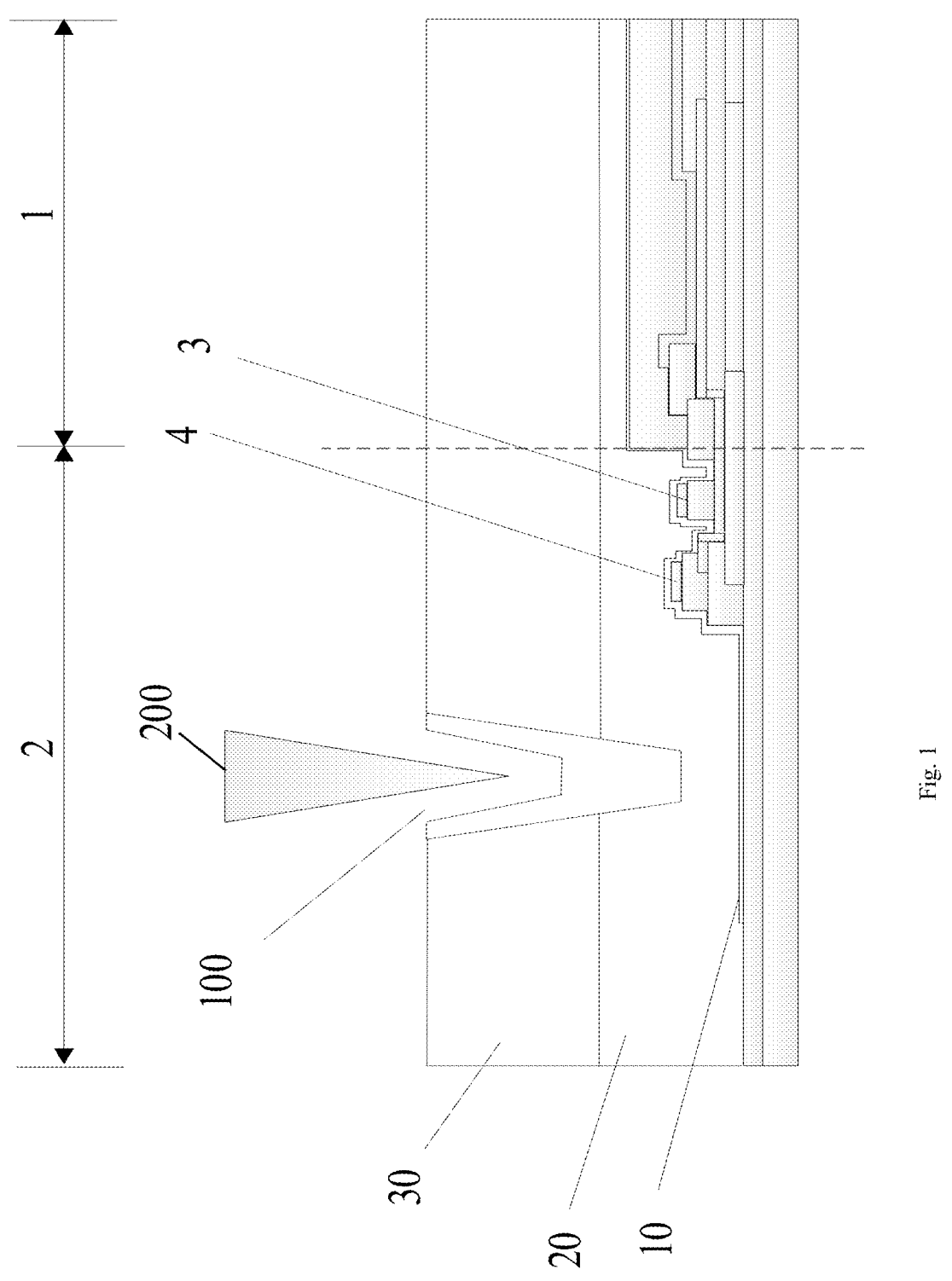
FIG. 1 is a schematic structural diagram of a display mother board in the related art.

Referring to FIG. 1, a through hole directly facing a triangular pattern 200 is a cutting position 100. In the related art, the cutting position 100 is located right above an encapsulation layer 10, and when the laser cutting is performed, heat is conducted to the encapsulation layer 10, which causes the encapsulation layer 10 to be separated.

In view of the above-mentioned problem, the present embodiment provides a display substrate and a display mother board which is cut along a cutting line to form the display substrate. A patterned region PA is provided on a functional layer 20 between a protective film layer 30 and the encapsulation layer 10, and an orthographic projection of the cutting position 100 (namely, a position where the cutting line is located) onto the patterned region PA is in a hollowed-out region 5 of the patterned region PA. In this way, an air separation layer (namely, an air column) is formed between the encapsulation layer 10 and the protective film layer 30 at the cutting position 100, namely, causing the space under the laser cutting position 100 to be empty. Since the air has a poorer thermal conduction than OC organic materials or inorganic materials, the problem of separation of the encapsulation layer 10 below the functional layer 20 is avoided.

Figure 2:
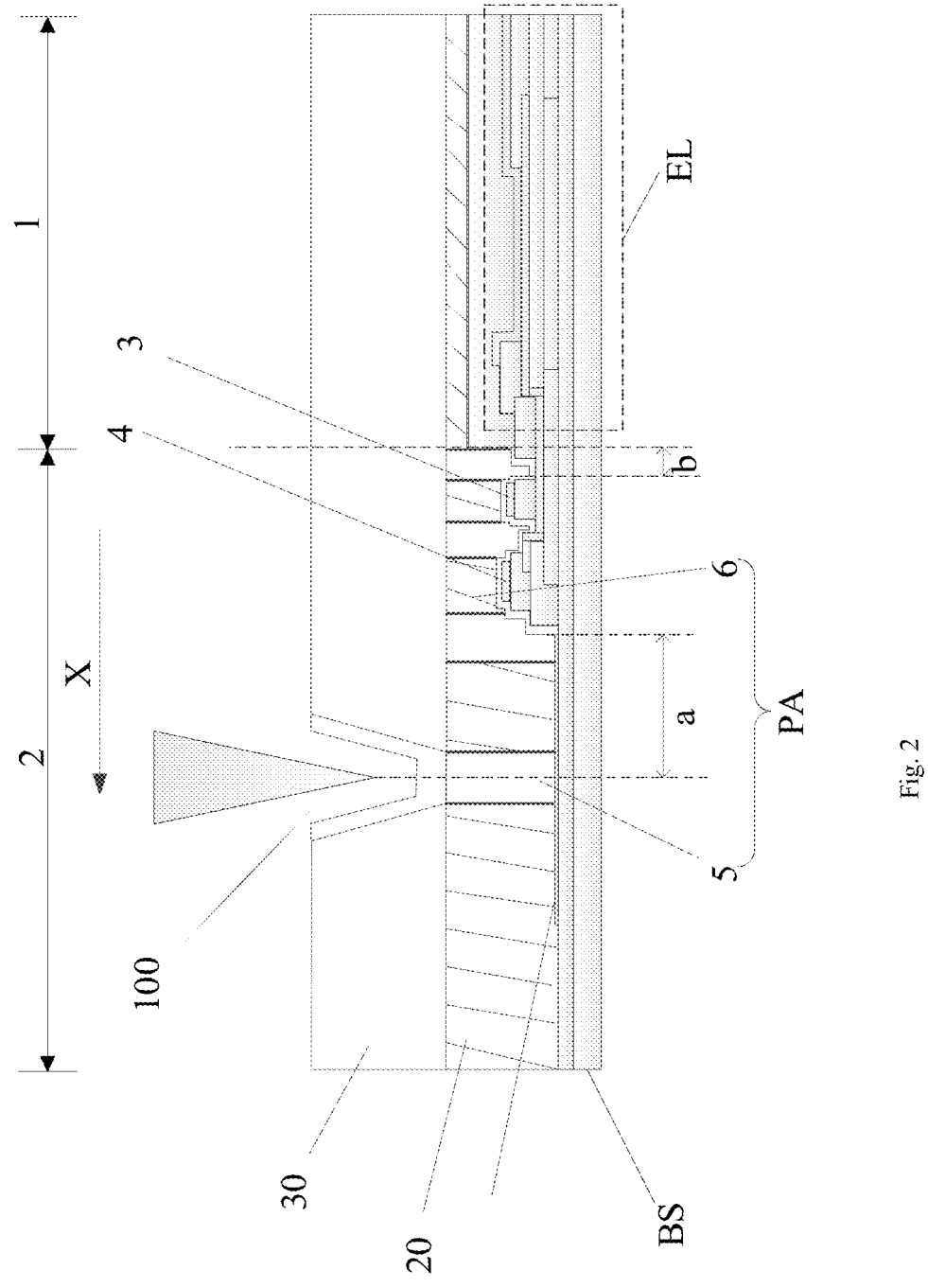
FIG. 2 is a first schematic structural diagram of a display mother board in an embodiment of the present disclosure.
Figure 3:
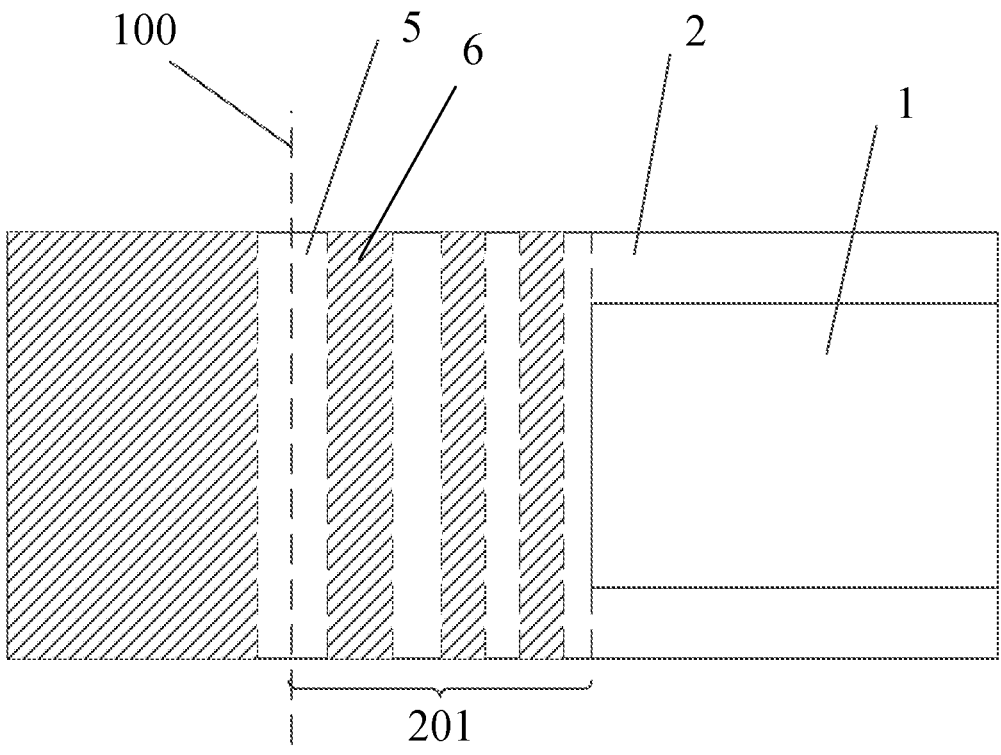
FIG. 3 is a second schematic structural diagram of a display mother board in an embodiment of the present disclosure.

Specifically, referring to FIG. 2 and FIG. 3, an embodiment provides a display substrate, including: a base substrate BS, a light-emitting unit EL arranged on the base substrate BS, and an encapsulation layer 10 arranged on a side of the light-emitting unit EL away from the base substrate BS.

The display substrate includes a display area 1 and a non-display area 2 at the periphery of the display area 1. A functional layer 20 and a protective film layer 30 are arranged sequentially in a side of the encapsulation layer 10 away from the base substrate BS. The functional layer 20 includes a patterned region PA in the non-display area 2, a pattern of the patterned region PA includes a hollowed-out region 5 and a filling region 6, and the hollowed-out region 5 forms an air column which is opened and located at the edge of the display substrate.

FIG. 2 shows a schematic diagram of a partial structure of a mother board. In FIG. 2, the position of the through hole corresponding to the triangular pattern is a cutting position 100, and an air column is located right below the cutting position 100, so that an air isolation layer is formed in the encapsulation layer 10 at the cutting position 100, reducing the amount of heat transmitted to the encapsulation layer 10 during laser cutting, thereby alleviating the problem that the encapsulation layer 10 is cut out.

Since the cutting position directly faces the position of one air column, the corresponding air column is opened at the edge of the formed display substrate. Generally, the extension direction of a cutting line is parallel to the extension direction of one edge of the display substrate. Therefore, illustratively in an embodiment, the hollowed-out region 5 is arranged to extend along the extension direction of the cutting line, see FIG. 3.

It should be noted that the pattern may only include the hollowed-out region 5 directly below the cutting position 100. However, in actual operation, there exists an error in the cutting position 100, and if the cutting position 100 is shifted, the encapsulation layer 10 corresponds to an area at the cutting position 100, and no air isolation layer is formed, or the cutting position 100 is close to the display area 1, which is liable to cause the heat to be transferred to the encapsulation layer 10 or a film layer of the display area 1. In order to solve this problem, Illustratively in an embodiment, the non-display area 2 includes a barrier wall surrounding the periphery of the display area 1, the patterned region PA is located in a first region 201 including the barrier wall, a first edge of the first region 201 at a side of the barrier wall away from the display area 1 is at a distance of 50 μm to 300 μm from the barrier wall, and a second edge of the first region 201 at a side of the barrier wall close to the display area 1 is at a distance of 50 μm to 150 μm from the barrier wall.

The barrier wall includes a first sub-barrier wall 3 that surrounds the periphery of the display area 1, and a second sub-barrier wall 4 that surrounds the periphery of the first sub-barrier wall 3. The distance a between the first edge of the first region 201 at a side of the second sub-barrier wall 4 away from the display area 1 and the second sub-barrier wall 4 is 50 μm to 300 μm, and the distance b between a second edge of the first region 201 at a side of the first sub-barrier wall 3 close to the display area 1 and the first sub-barrier wall 3 is 50 μm to 150 μm, see FIG. 2.

The pattern may have many specific structural forms, and several structural forms of the pattern in the embodiments are described in detail below.

Figure 4:
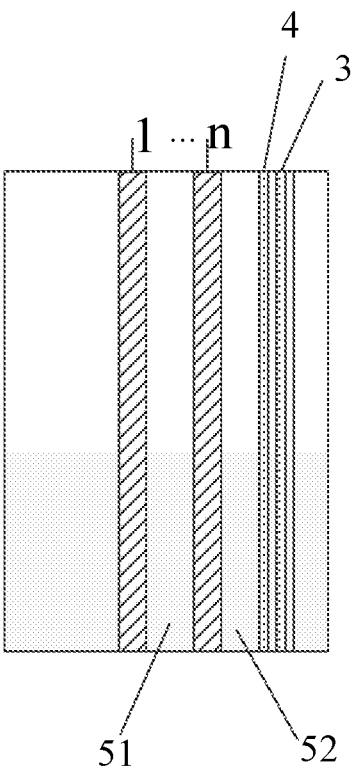
FIG. 4 is a first schematic structural diagram of a pattern in an embodiment of the present disclosure.
Figure 5:
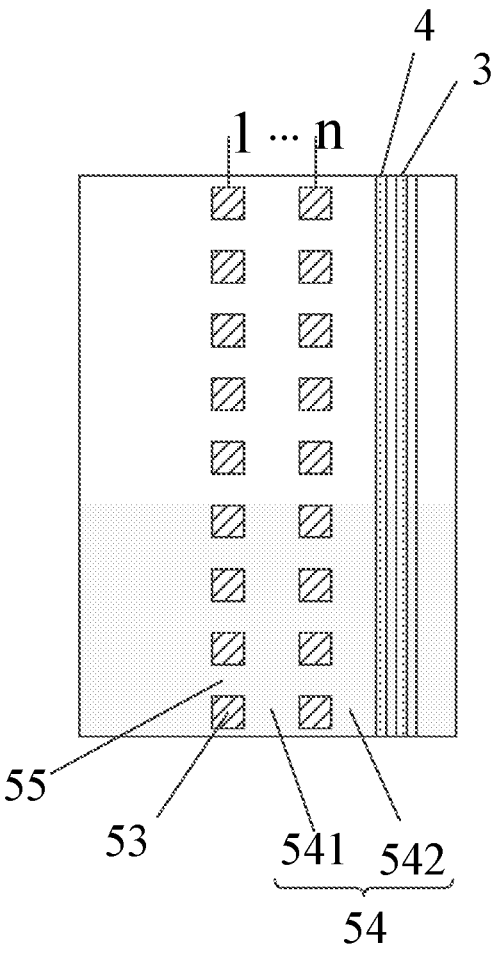
FIG. 5 is a second schematic structural diagram of a pattern in an embodiment of the present disclosure.
Figure 6:
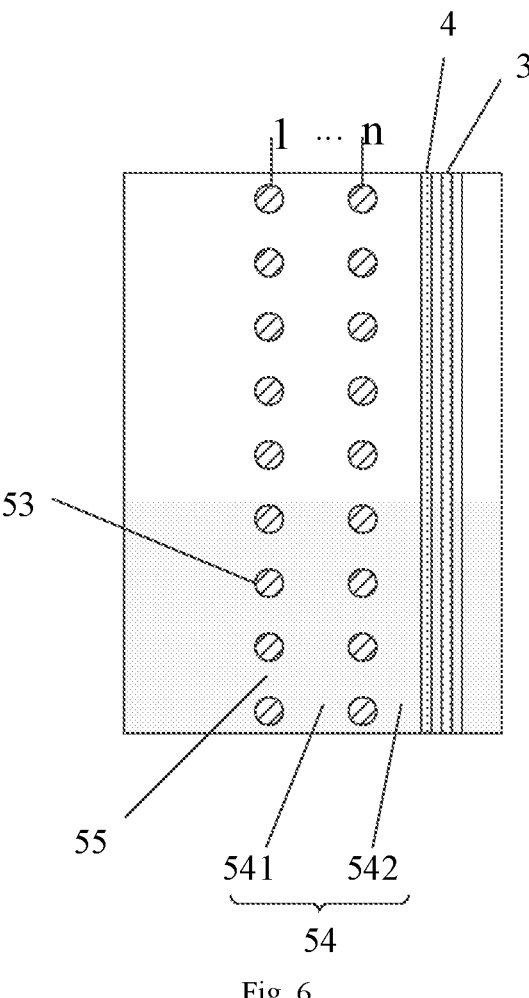
FIG. 6 is a third schematic structural diagram of a pattern in an embodiment of the present disclosure.

As shown in FIG. 4, illustratively in an embodiment, the pattern includes a first sub-pattern at a side of the display area 1 along a first direction (referring to the direction X in FIG. 1), the first sub-pattern includes a plurality of hollowed-out regions 5 and a plurality of filling regions 6 which are arranged alternately along the first direction, and the hollowed-out region 5 extends in a direction intersecting with the first direction.

Illustratively in an embodiment, the hollowed-out region 5 extends in a direction perpendicular to the first direction, which is not limited thereto.

Illustratively in an embodiment, the plurality of hollowed-out regions 5 include a first hollowed-out sub-region 51 at the cutting position 100 and a second hollowed-out sub-region 52 other than the first hollowed-out sub-region 51, and a width of the first hollowed-out sub-region 51 in the first direction is greater than a width of the second hollowed-out sub-region 52 in the first direction.

In order to effectively solve the problem that the encapsulation layer 10 is separated due to heat conduction during cutting, the width of the first hollowed-out sub-region 51 at the cutting position 100 is relatively large.

In the embodiment, in order to effectively prevent the shift of the cutting position 100 due to an error and avoid the influence on the performance of the functional layer 20, the area where the hollowed-out region 5 is arranged extends to the side of the barrier wall close to the display area 1, and the width of the second hollowed-out sub-region 52 in the first direction decreases as the distance between the second hollowed-out sub-region 52 and the first hollowed-out sub-region 51 increases.

The specific structural form of the hollowed-out regions is not limited as described above. For example, in an implementation of the embodiments, a plurality of hollowed-out regions 5 have the same width in the first direction. That is to say, the plurality of hollowed-out regions 5 include a first hollowed-out sub-region 51 at the cutting position 100 and a second hollowed-out sub-region 52 other than the first hollowed-out sub-region 51, and the width of the first hollowed-out sub-region 51 in the first direction is equal to the width of the second hollowed-out sub-region 52 in the first direction.

Illustratively in an embodiment, the width of the hollowed-out region 5 in the first direction ranges from 3 μm to 50 μm.

In this embodiment, the number of the hollowed-out regions 5 can be set according to actual needs, as shown in FIG. 4, reference signs: 1, . . . , n, n represents the number of the hollowed-out regions 5, and n≥1 (it needs to be explained that the number of the first hollowed-out sub-region 51 is 1, and the number of the second hollowed-out sub-regions 52 increases as n increases).

The pattern in the patterned region PA may be set according to actual needs, and are not limited as described above. The pattern in another structural form is described below in an implementation of the embodiments. As shown in FIGS. 5 to 8, the pattern includes a second sub-pattern located at a side of the display area 1 along a first direction (referring to the direction X in FIG. 1), the second sub-pattern includes a hollowed-out region 5 and a filling region 6 that are arranged alternately, the filling region 6 include a plurality of columns of filling sub-regions arranged at intervals along the first direction, each column of filling sub-regions includes a plurality of filling portions 53 arranged at intervals along a second direction, and the hollowed-out regions 5 include first hollowed-out sub-regions 54 located between adjacent two columns of filling sub-regions, and second sub-hollowed regions 55 located between adjacent two filling portions 53 along the second direction, where the second direction is perpendicular to the first direction, and the cutting position 100 is on the first hollowed-out sub-region 54.

Illustratively in an embodiment, the plurality of first hollowed-out sub-regions 54 includes a first hollowed-out portion 541 at the cutting position 100 and a second hollowed-out portion 542 other than the first hollowed-out portion 541, and a width of the first hollowed-out portion 541 in the first direction is greater than a width of the second hollowed-out portion 542 in the first direction.

Illustratively in an embodiment, in order to effectively prevent the shift of the cutting position 100 due to an error and to avoid the influence on the performance of the functional layer 20, the width of the hollowed-out portion 542 in the first direction decreases as the distance between the hollowed-out portion 542 and the first hollowed-out portion 541 increases.

A specific structural form of the first hollowed-out sub-regions is not limited as described above. For example, in an implementation of this embodiment, multiple first hollowed-out sub-regions 54 have the same width in the first direction. That is to say, the multiple first hollowed-out sub-regions 54 include a first hollowed-out portion 541 at the cutting position 100 and a second hollowed-out portion 542 other than the first hollowed-out portion 541, and the width of the first hollowed-out portion 541 in the first direction is equal to the width of the second hollowed-out portion 542 in the first direction.

Illustratively in an embodiment, the width of adjacent two first hollowed-out sub-regions 54 in the first direction is 3 μm to 50 μm, and the width of adjacent two second hollowed-out sub-regions 55 in a second direction perpendicular to the first direction is 3 μm to 50 μm.

In the embodiments, the number of the first hollowed-out sub-regions 54 can be set according to actual needs, for example, reference signs: 1, . . . , n, as shown in FIGS. 5-8, n represents the number of the first hollowed-out sub-regions 54, and n≥1 (it needs to be explained that the number of the first hollowed-out portion 541 is 1, and the number of the second hollowed-out portion 542 increases as n increases).

Illustratively in an embodiment, a shape of a cross section of the filling portion 53 in a direction parallel to the base substrate BS is rectangular or circular, or in other geometric shapes. The shape of the cross section of the filling portion 53 in the direction parallel to the base substrate BS is square in FIG. 5; and the shape of the cross section of the filling portion 53 in the direction parallel to the base substrate BS is circular in FIG. 6, which is not limited thereto.

Figures 7, 8:
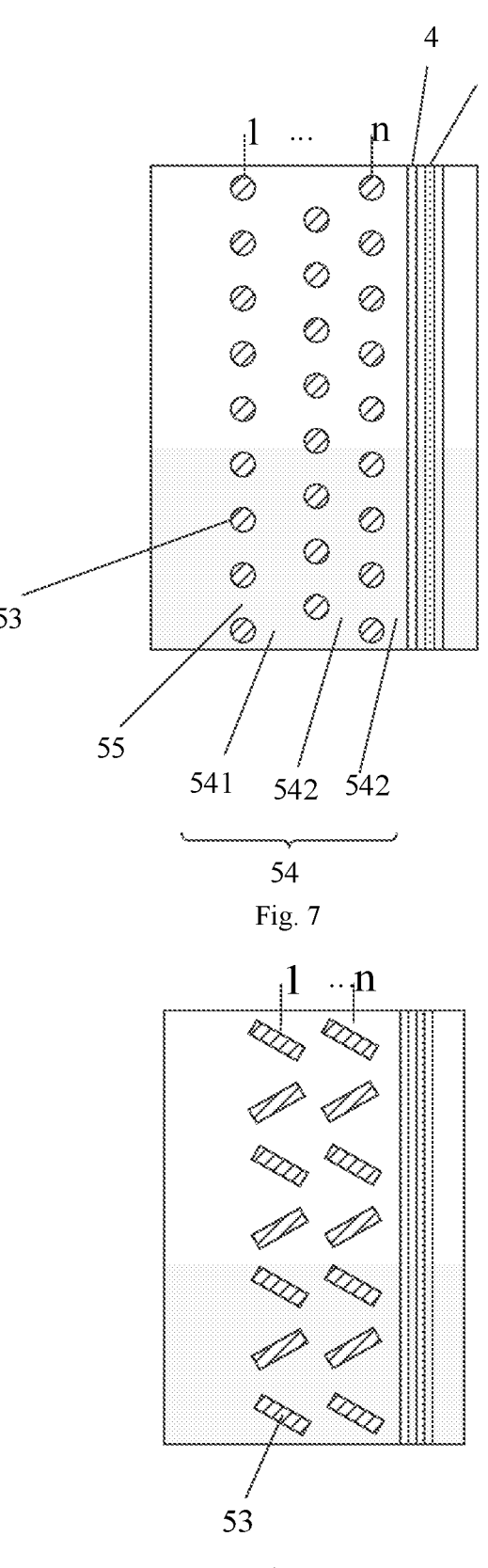
FIG. 7 is a fourth schematic structural diagram of a pattern in an embodiment of the present disclosure.
FIG. 8 is a fifth schematic structural diagram of a pattern in an embodiment of the present disclosure.

As shown in FIG. 7, illustratively in an embodiment, the filling portions 53 in adjacent two columns of filling sub-regions are staggered. It should be noted that a distance in the first direction between adjacent two columns of filling sub-regions in FIG. 7 is merely schematic.

As shown in FIG. 8, each filling portion 53 has a cross section of strip-shaped structure in a direction parallel to the base substrate BS, an extension direction of the strip-shaped structure has an included angle with the first direction, adjacent two filling portions 53 in the same column of filling sub-regions are inclined in opposite directions, and adjacent two filling portions 53 in adjacent two columns of filling sub-regions are inclined in the same direction.

Illustratively in an embodiment, the functional layer 20 is a touch control film layer 20A, the touch control film layer 20A includes a first metal layer, an insulating layer, a second metal layer and a protective layer, which are arranged in sequence along a direction away from the base substrate BS, and the pattern is formed on at least one film layer of: the first metal layer, the insulating layer, the second metal layer and the protective layer.

Figure 9:
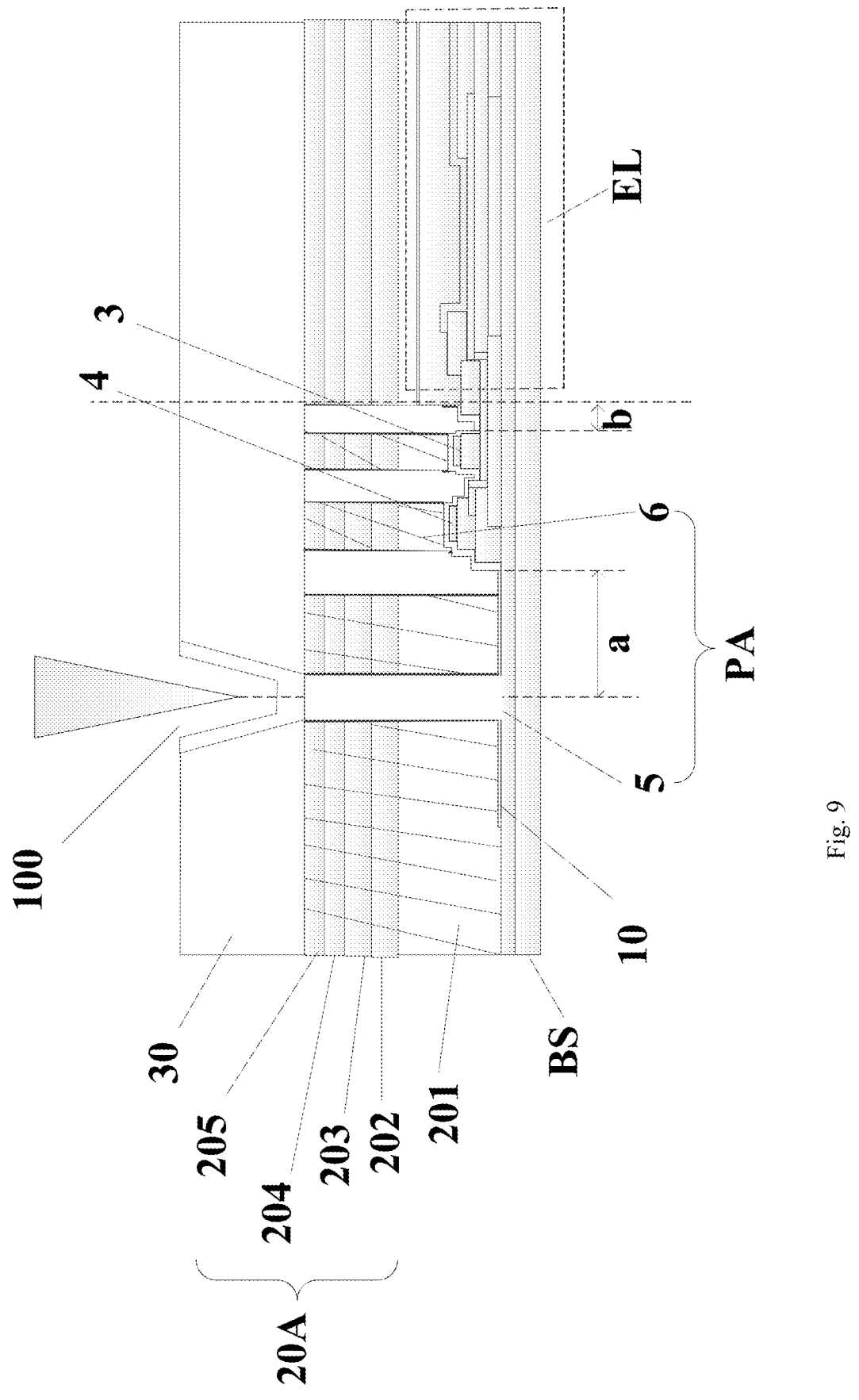
FIG. 9 is a third schematic structural diagram of a display mother board in an embodiment of the present disclosure.

Illustratively in an embodiment, a TBL (touch barrier layer 201) is provided on one side of the encapsulation layer away from the base substrate BS. A first metal layer 202, an insulating layer 203, a second metal layer 204 and a protective layer 205 are provided in sequence on one side of the touch barrier layer 201 away from the base substrate BS, and the pattern is formed on at least one film layer of: the touch barrier layer 201, the first metal layer 202, the insulating layer 203, the second metal layer 204 and the protective layer 205, see FIG. 9.

Figure 10:
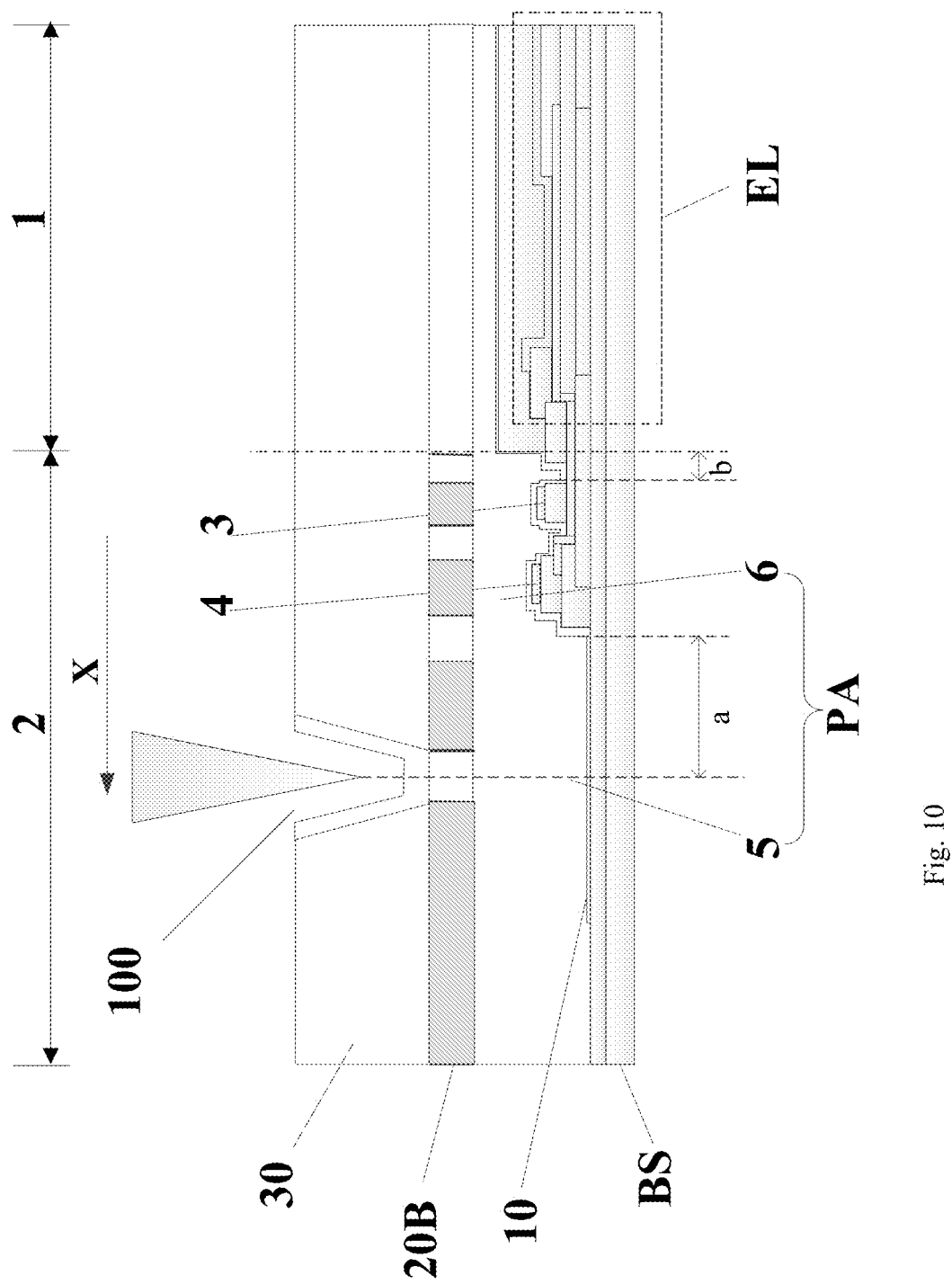
FIG. 10 is a fourth schematic structural diagram of a display mother board in an embodiment of the present disclosure.

Illustratively in an embodiment, the functional layer 20 is a color film layer 20B, see FIG. 10.

Illustratively in an embodiment, the color film layer includes a black matrix with a plurality of openings, and a color resistance layer in the openings, and the pattern is formed on the black matrix or arranged in the same layer as the black matrix.

Illustratively in an embodiment, the display substrate includes a color film layer and a touch control film layer, and the pattern is formed on the touch control film layer and/or the color film layer.

The display substrate includes a base substrate BS, and a color film layer and a touch control film layer on the base substrate BS, and the color film layer is located at a side of the touch control film layer away from the base substrate BS, or the color film layer is located at a side of the touch control film layer close to the base substrate BS.

A TBL (touch barrier layer 201) is provided on one side of the encapsulation layer away from the base substrate BS. A first metal layer 202, an insulating layer 203, a second metal layer 204 and a protective layer 205 are provided in sequence on one side of the touch barrier layer 201 away from the base substrate BS. The pattern is formed on at least one film layer of: the touch barrier layer 201, the first metal layer 202, the insulating layer 203, the second metal layer 204 and the protective layer 205, or the pattern is arranged in the same layer as at least one film layer of: the touch barrier layer 201, the first metal layer 202, the insulating layer 203, the second metal layer 204 and the protective layer 205.

Alternatively, the color film layer includes a black matrix with a plurality of openings, and a color resistance layer in the openings, and the pattern is formed on the black matrix or arranged in the same layer as the black matrix.

Alternatively, the functional layer includes at least one film layer of the touch control film layer, and the color film layer. The pattern is formed on at least one film layer of: the touch barrier layer 201, the first metal layer 202, the insulating layer 203, the second metal layer 204 and the protective layer 205, and on the color film layer, or the pattern is arranged on the same layer as the color film layer and at least one film layer of: the touch barrier layer 201, the first metal layer 202, the insulating layer 203, the second metal layer 204 and the protective layer 205.

In this embodiment, at least one film layer of the touch control film layer or the color film layer in the display substrate is used to form the pattern, without adding other structures, thereby simplifying the structure and reducing the cost.

It should be noted that the pattern is formed on a functional layer or provided in the same layer as the functional layer, and the pattern is formed on at least one of functional film layers or provided in the same layer as at least one of the functional film layers when the functional layer includes at least two film layers. The pattern may be formed simultaneously when the functional layer is formed by a coating process, so that the pattern is arranged in the same layer as the corresponding film layer, namely, the hollowed-out region in the pattern completely penetrates the corresponding film layer. The pattern may also be formed through an etching process after a base substrate layer is formed on the encapsulation layer, and then the hollowed-out region of the pattern is formed by etching a part of the corresponding film layer, namely, the hollowed-out region of the pattern does not completely penetrate the corresponding film layer.

An embodiment further provides a display mother board, used to form the above-mentioned display substrate along a cut line, an orthographic projection of the cut line onto the functional layer is located within the air column. The space under the laser cutting position 100 is hollowed out, and since the thermal conduction of air is poor with respect to the thermal conduction of OC organic materials or inorganic materials, the problem of separation of the encapsulation layer 10 below the functional layer 20 is avoided.

An embodiment of the present disclosure further provides a display apparatus including the display panel described above.

The display apparatus may be any product or component with a display function, such as a liquid crystal television, a liquid crystal display, a digital photo frame, a mobile phone, a tablet computer. The display apparatus further includes a flexible circuit board, a printed circuit board and a back plate.

While the foregoing is directed to the preferred embodiments of the present disclosure, it will be understood by those skilled in the art that numerous modifications and adaptations can be made without departing from the principles of the disclosure, and such modifications and adaptations shall also fall within the protection scope of this disclosure.

What is claimed is:

1. A display substrate, comprising: a base substrate, a light-emitting unit on the base substrate, and an encapsulation layer on a side of the light-emitting unit away from the base substrate, wherein the display substrate comprises a display area and a non-display area at a periphery of the display area, a functional layer is arranged on a side of the encapsulation layer away from the base substrate, the functional layer comprises a patterned region in the non-display area, a pattern of the patterned region comprises a hollowed-out region and a filling region, and the hollowed-out region forms an air column; and wherein the functional layer consists of either a touch control film layer or a color film layer, wherein the touch control film layer comprises a first metal layer, an insulating layer, a second metal layer and a protective layer that are arranged in sequence along a direction away from the base substrate, and the pattern is formed on at least one film layer of: the first metal layer, the insulating layer, the second metal layer and the protective layer.

2. The display substrate according to claim 1, wherein the non-display area comprises a barrier wall surrounding the periphery of the display area, the patterned region is located in a first region comprising the barrier wall, a first edge of the first region at a side of the barrier wall away from the display area is at a distance of 50 μm to 300 μm from the barrier wall, and a second edge of the first region at a side of the barrier wall close to the display area is at a distance of 50 μm to 150 μm from the barrier wall.

3. The display substrate according to claim 1, wherein the pattern comprises a first sub-pattern at one side of the display area along a first direction, the first sub-pattern comprises a plurality of hollowed-out regions and a plurality of filling regions that are arranged alternately along the first direction, and each of the hollowed-out regions extend in a direction intersecting with the first direction.

4. The display substrate according to claim 3, wherein the plurality of hollowed-out regions comprises a first hollowed-out sub-region at an edge of the display substrate and a second hollowed-out sub-region other than the first hollowed-out sub-region, and in the first direction, a width of the second hollowed-out sub-region decreases as a distance between the second hollowed-out sub-region and the first hollowed-out sub-region increases.

5. The display substrate according to claim 3, wherein a width of each of the hollowed-out regions in the first direction is 3 μm to 50 μm.

6. The display substrate according to claim 1, wherein the pattern comprises a second sub-pattern at one side of the display area along a first direction, the second sub-pattern comprises a hollowed-out region and a filling region arranged alternately, the filling region comprises a plurality of columns of filling sub-regions arranged at intervals along the first direction, each column of the filling sub-regions comprises a plurality of filling portions arranged at intervals along a direction perpendicular to the first direction, and the hollowed-out region comprises first hollowed-out sub-regions located between adjacent two columns of filling sub-regions, and second hollowed-out sub-regions located between adjacent two filling portions of the filling portions.

7. The display substrate according to claim 6, wherein the plurality of first hollowed-out sub-regions comprises a first hollowed-out portion located at an edge of the display substrate and a second hollowed-out portion other than the first hollowed-out portion, and in the first direction, a width of the second hollowed-out portion decreases as the distance between the second hollowed-out portion and the first hollowed-out portion increases.

8. The display substrate according to claim 6, wherein a width of adjacent two first hollowed-out sub-regions in the first direction is 3 μm to 50 μm, and a width of adjacent two second hollowed-out sub-regions in a second direction perpendicular to the first direction is 3 μm to 50 μm.

9. The display substrate according to claim 6, wherein filling portions in adjacent two columns of filling sub-regions are arranged in a staggered manner.

10. The display substrate according to claim 6, wherein each of the filling portions has a cross section of strip-shaped structure in a direction parallel to the base substrate, an extension direction of the strip-shaped structure has an included angle with the first direction, adjacent two filling portions in the same column of filling sub-regions are inclined in opposite directions, and adjacent two filling portions in adjacent two columns of filling sub-regions are inclined in a same direction.

11. A display mother board, used to form the display substrate according to claim 1 along a cut line, wherein an orthographic projection of the cut line onto the functional layer is located within the air column.

12. A display apparatus, comprising the display substrate according to claim 1.

* * * * *